United States Patent
Hong et al.

(10) Patent No.: US 10,418,420 B2
(45) Date of Patent: Sep. 17, 2019

(54) LIGHT-EMITTING DISPLAY DEVICE

(71) Applicant: Samsung Display Co., Ltd., Yongin-si (KR)

(72) Inventors: Sang Min Hong, Cheonan-si (KR); Heeseong Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 3 days.

(21) Appl. No.: 15/728,935

(22) Filed: Oct. 10, 2017

(65) Prior Publication Data

US 2018/0233543 A1    Aug. 16, 2018

(30) Foreign Application Priority Data

Feb. 16, 2017  (KR) ................. 10-2017-0020943

(51) Int. Cl.
*H01L 27/32* (2006.01)
*H01L 51/52* (2006.01)

(52) U.S. Cl.
CPC ...... *H01L 27/3211* (2013.01); *H01L 27/3216* (2013.01); *H01L 27/3276* (2013.01); *H01L 51/5218* (2013.01); *H01L 51/5271* (2013.01)

(58) Field of Classification Search
CPC ............. H01L 27/3211; H01L 27/3213; H01L 27/3216; H01L 27/3218; H01L 27/3276; H01L 27/3279; H01L 51/5271; H01L 51/5206; H01L 51/5209; H01L 51/5212; H01L 51/5215; H01L 51/5218
See application file for complete search history.

(56) References Cited

U.S. PATENT DOCUMENTS

| | | | |
|---|---|---|---|
| 6,853,132 B2 | 2/2005 | Maeda | |
| 7,626,660 B2 | 12/2009 | Takizawa et al. | |
| 8,319,234 B2 | 11/2012 | Jeong et al. | |
| 8,698,395 B2 | 4/2014 | Im et al. | |

(Continued)

FOREIGN PATENT DOCUMENTS

| | | |
|---|---|---|
| JP | 3714179 | 11/2005 |
| KR | 10-0654817 | 12/2006 |

(Continued)

*Primary Examiner* — Thanhha S Pham
(74) *Attorney, Agent, or Firm* — H.C. Park & Associates, PLC

(57) ABSTRACT

A light-emitting display apparatus includes a substrate, a first pixel electrode, a second pixel electrode, a first electroluminescent layer, and a second electroluminescent layer. The substrate includes a first region adjacent to a second region. The first pixel electrode overlaps the first region. The first pixel electrode includes a first transparent conductive layer. The second pixel electrode overlaps the second region. The second pixel electrode includes a second transparent conductive layer. The first electroluminescent layer is disposed on the first pixel electrode. The first electroluminescent layer is configured to emit light in a first range of wavelengths. The second electroluminescent layer is disposed on the second pixel electrode. The second electroluminescent layer is configured to emit light in a second range of wavelengths different from the first range of wavelengths. Resistivity of the first transparent conductive layer is different from resistivity of the second transparent conductive layer.

23 Claims, 9 Drawing Sheets

(56) References Cited

U.S. PATENT DOCUMENTS

2013/0285023 A1* 10/2013 Kurata ................ H01L 51/5265
                                                           257/40
2015/0137081 A1   5/2015 Kim et al.
2016/0104750 A1*  4/2016 Jinta .................. H01L 51/5271
                                                           257/40

FOREIGN PATENT DOCUMENTS

| KR | 10-0700013      | 3/2007 |
| KR | 10-2012-0003216 | 1/2012 |
| KR | 10-2015-0056375 | 5/2015 |
| KR | 10-2016-0056401 | 5/2016 |

* cited by examiner

LIGHT-EMITTING DISPLAY DEVICE

CROSS-REFERENCE TO RELATED APPLICATION

This application claims priority from and the benefit of Korean Patent Application No. 10-2017-0020943, filed on Feb. 16, 2017, which is hereby incorporated by reference for all purposes as if fully set forth herein.

BACKGROUND

Field

One or more exemplary embodiments relate to display technology, and, more particularly, to a light-emitting display apparatus.

Discussion of the Background

A conventional light-emitting display apparatus, such as an organic light-emitting display apparatus, is a self-luminous display that includes a plurality of light-emitting devices, such as a plurality of organic light-emitting devices. For instance, each of the organic light-emitting devices may include a hole injection electrode, an electron injection electrode, and an organic emission layer formed between the hole injection electrode and the electron injection electrode. Excitons are generated in response to holes injected from the hole injection electrode and electrons injected from the electron injection electrode being combined in the organic emission layer. When the excitons drop from an excited state to a ground state, light is generated or otherwise emitted. As such, a conventional light-emitting display apparatus does not require a separate light source, and may be driven with a relatively low voltage. Conventional light-emitting displays may also be relatively lightweight and relatively slim, not to mention, may provide improvements in contrast and response time.

The above information disclosed in this section is only for enhancement of an understanding of the background of the inventive concepts, and, therefore, may contain information that does not form prior art already known to a person of ordinary skill in the art.

SUMMARY

One or more exemplary embodiments provide a light-emitting display apparatus.

One or more exemplary embodiments provide a light-emitting display apparatus that improves efficiency and color shift characteristics according to changes in viewing angle via differences in transmittances of various transparent layers of pixels.

One or more exemplary embodiments provide a light-emitting display apparatus that improves efficiency and color shift characteristics according to changes in viewing angle via a plurality of apertures formed in various reflective layers of pixels.

Additional aspects will be set forth in the detailed description which follows, and, is in part, will be apparent from the disclosure, or may be learned by practice of the inventive concept.

According to one or more exemplary embodiments, a light-emitting display apparatus includes a substrate, a first pixel electrode, a second pixel electrode, a first electroluminescent layer, and a second electroluminescent layer. The substrate includes a first region adjacent to a second region. The first pixel electrode overlaps the first region. The first pixel electrode includes a first transparent conductive layer. The second pixel electrode overlaps the second region. The second pixel electrode includes a second transparent conductive layer. The first electroluminescent layer is disposed on the first pixel electrode. The first electroluminescent layer is configured to emit light in a first range of wavelengths. The second electroluminescent layer is disposed on the second pixel electrode. The second electroluminescent layer is configured to emit light in a second range of wavelengths different from the first range of wavelengths. Resistivity of the first transparent conductive layer is different from resistivity of the second transparent conductive layer.

According to one or more exemplary embodiments, a light-emitting display apparatus includes a substrate, a first pixel electrode, a second pixel electrode, a first electroluminescent layer, and a second electroluminescent layer. The substrate includes a first region adjacent to a second region. The first pixel electrode overlaps the first region. The first pixel electrode includes a first reflective layer. The second pixel electrode overlaps the second region. The second pixel electrode includes a second reflective layer. The first electroluminescent layer is disposed on the first pixel electrode. The first electroluminescent layer is configured to emit light in a first range of wavelengths. The second electroluminescent layer is disposed on the second pixel electrode. The second electroluminescent layer is configured to emit light in a second range of wavelengths different from the first range of wavelengths. The first reflective layer includes a plurality of apertures.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
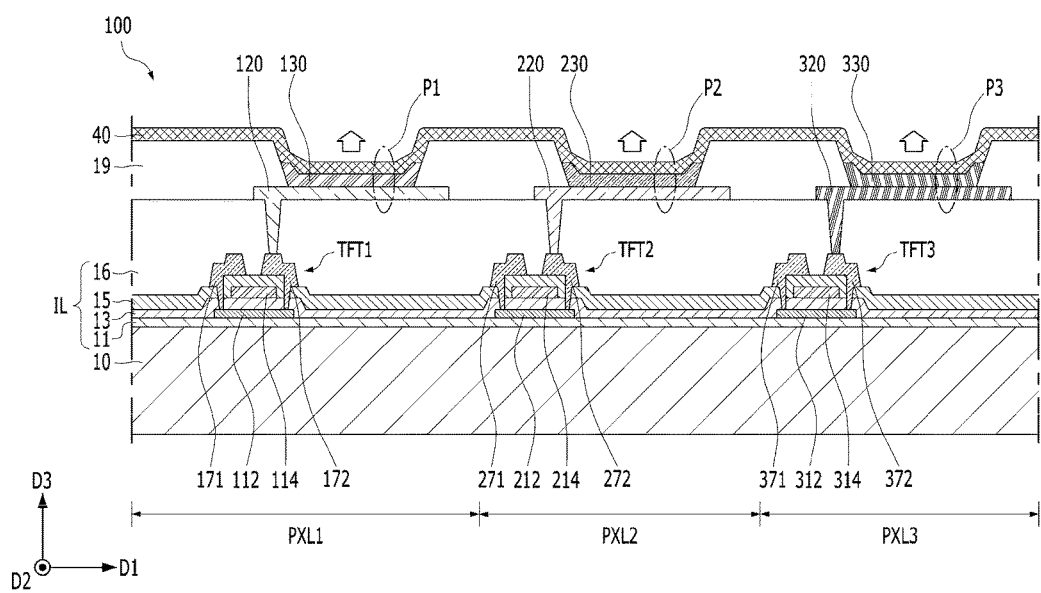
FIG. 1 is a schematic cross-sectional view of a portion of a light-emitting display apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of crosshatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to organic light-emitting displays, it is contemplated that various exemplary embodiments are also applicable to other types of displays, such as liquid crystal displays, inorganic light-emitting displays, field emission displays, plasma displays, electrophoretic displays, electrowetting displays, and the like.

FIG. 1 is a schematic cross-sectional view of a portion of a light-emitting display apparatus, according to one or more exemplary embodiments. For instance, the portion of light-emitting display apparatus (or display apparatus) 100 may be a unit pixel of display apparatus 100 including various sub-pixels, or the portion of display apparatus 100 may correspond to multiple unit pixels of display apparatus 100.

For descriptive convenience, display apparatus 100 will be described in association with the portion of display apparatus 100 corresponding to a unit pixel including various sub-pixels.

According to one or more exemplary embodiments, display apparatus 100 includes substrate 10 having first sub-pixel region PXL1, second sub-pixel region PXL2, and third sub-pixel region PXL3. First sub-pixel region PXL1 includes first pixel electrode 120, first intermediate layer 130, and opposite electrode 40 sequentially disposed on substrate 10. First intermediate layer 130 includes a first electroluminescent layer, e.g., a first organic light-emitting layer. Second sub-pixel region PXL2 includes second pixel electrode 220, second intermediate layer 230, and opposite electrode 40 sequentially disposed on substrate 10. Second intermediate layer 230 includes a second electroluminescent layer, e.g., a second organic light-emitting layer. Third sub-pixel region PXL3 includes third pixel electrode 320, third intermediate layer 330, and opposite electrode 40 sequentially disposed on substrate 10. Third intermediate layer 330 includes a third electroluminescent layer, e.g., a third organic light-emitting layer.

In one or more exemplary embodiments, display apparatus 100 may be a deformable (e.g., bendable, foldable, flexible, stretchable, rollable, etc.) display panel or a rigid display panel. It is also contemplated that display apparatus 100 may include one or more deformable regions and one or more ridged regions. As such, substrate 10 may be formed of any suitable material, such as, for example, a glass material, a quartz material, a ceramic material, a metal material (e.g., stainless steel, titanium, etc.), a plastic material, etc. For instance, substrate 10 may be formed of a polymer material, e.g., polyarylate (PAR), polybeneimidazole (PBI), polycarbonate (PC), polyetherimide (PEI), polyethylene naphthalate (PEN), polyethersulphone (PES), polyethylene terephthalate (PET), polysulfone, polyimide (PI), fiber glass reinforced plastic (FRP), and/or the like. Further, substrate 10 may be transparent, translucent, or opaque.

Although not illustrated, substrate 10 may be formed as a multilayered structure including one or more organic material layers (e.g. one or more polymer materials) and one or more inorganic material layers (e.g., one or more of silicon nitride (SiNx), silicon oxide (SiOx), silicon oxynitride (SiOxNy), and the like). The one or more organic material layers and the one or more inorganic material layers may be stacked in any suitable fashion, e.g., alternately stacked, symmetrically ordered, etc. It is also contemplated that one or more conductive layers, e.g., metal layers, signal lines, etc., may be embedded in substrate 10. For instance, one or more conductive layers may be disposed between layers of a multilayer structure forming substrate 10.

According to one or more exemplary embodiments, display apparatus 100 may include first thin-film transistor TFT1, second thin-film transistor TFT2, and third thin-film transistor TFT3 that are electrically connected to first pixel electrode 120, second pixel electrode 220, and third pixel electrode 320, respectively. The structures of the first to third thin-film transistors TFT1 to TFT3 are not limited to the structure shown in FIG. 1. In this manner, any number and/or structure of a thin-film transistor may be utilized.

Buffer layer 11 may be disposed on substrate 10. Active layers 112, 212, and 312 of first to third thin-film transistors TFT1, TFT2, and TFT3 may be respectively disposed on buffer layer 11. Buffer layer 11 may planarize a surface (e.g., upper surface) of substrate 10 and may prevent impurities from infiltrating (or contaminating) active layers 112, 212, and 312. It is noted that buffer layer 11 may be formed of any suitable organic compound and/or inorganic compound, as well as may be formed having a single layer or multilayer structure.

Active layers 112, 212, and 312 may include any suitable material, e.g., any suitable semiconductor material. For example, active layers 112, 212, and 312 may contain an inorganic semiconductor material, such as amorphous silicon or polysilicon crystallized from amorphous silicon. Active layers 112, 212, and 312 may contain an oxide semiconductor material, such as an oxide of a material selected from a group XII, XIII, or XIV element, e.g., zinc (Zn), indium (In), gallium (Ga), tin (Sn), cadmium (Cd), germanium (Ge), and hafnium (Hf), etc., or combinations thereof. It is also contemplated that active layers 112, 212, and 312 may be formed of a relatively low polymer-series or polymer-series organic material, such as, for example, mellocyanine, phthalocyanine, pentacene, thiophen, etc.

Gate insulating layer 13 may be disposed on buffer layer 11 to cover active layers 112, 212, and 312. Gate insulating layer 13 may be formed of any suitable inorganic material, such as silicon nitride (SiNx), silicon oxide (SiOx), silicon oxynitride (SiOxNy), etc. Further, gate insulating layer 13 may include one or more layers. In one or more exemplary embodiments, at least one of the one or more layers may be formed from a different material than at least one other layer of the one or more layers.

Gate electrodes 114, 214, and 314 of first to third thin-film transistors TFT1 to TFT3 may be disposed on gate insulating layer 13. It is noted that gate electrodes 114, 214, and 314 may be formed having a single layer structure or a multilayer structure including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), neodymium (¥il-Nd), etc. Multilayer structures may include dual layer structures including Mo/Al-¥-il-Nd, Mo/Al, Ti/Al, etc. It is also contemplated that the multilayer structures may include layer formations of Mo/Al/Mo, Mo/Al-¥il-Nd/Mo, Ti/Al/Ti, Ti/Cu/Ti, etc. Further, silver nanowire (Ag-NW) may be used in association with one or more exemplary embodiments.

Interlayer insulating layer 15 may be disposed on gate electrodes 114, 214, and 314. Interlayer insulating layer 15 may be formed of any suitable material, such as, for example, an organic material (e.g., polyimide), an inorganic material (e.g., silicon nitride (SiNx), silicon oxide (SiOx), silicon oxynitride (SiOxNy), phosphorsilicate glass, borophosphosilicate glass, etc.), or combinations thereof. Interlayer insulating layer 15 may be formed having a single layer or multilayer structure. In one or more exemplary embodiments, at least one layer of a multilayer structure of interlayer insulating layer 15 may be formed from a different material than at least one other layer of the multilayer structure of interlayer insulating layer 15.

Source electrodes 171, 271, and 371 and drain electrodes 172, 272, and 372 of first to third thin-film transistors TFT1 to TFT3 may be disposed on interlayer insulating layer 15. Source electrodes 171, 271, and 371 and drain electrodes 172, 272, and 372 may be formed having a single layer structure or a multilayer structure including at least one of Al, Pt, Pd, Ag, Mg, Au, Ni, Nd, Ir, Cr, Li, Ca, Mo, Ti, W, Cu, ¥il-Nd, Ag-NW, etc. In one or more exemplary embodiments, a material of gate electrodes 114, 214, and 314 may be different than a material of source electrodes 171, 271, and 371 and drain electrodes 172, 272, and 372. It is contemplated, however, that the material of gate electrodes 114, 214, and 314 may be the same as the material of source electrodes 171, 271, and 371 and drain electrodes 172, 272, and 372. The number of conductive layers forming gate electrodes 114, 214, and 314 may be the same as (or different then) the number of conductive layers forming source electrodes 171, 271, and 371 and drain electrodes 172, 272, and 372.

Passivation layer 16 is disposed on first to third thin-film transistors TFT1 to TFT3 to cover first to third thin-film transistors TFT1 to TFT3 and one or more exposed portions of interlayer insulating layer 15. Passivation layer 16 may be formed of any suitable material, such as an inorganic material, an organic material, or combinations thereof. Passivation layer 16 may have a single layer structure or a multi-layer structure. To this end, passivation layer 16 may be a planarization film that reduces steps in one or more underlying layers (or structures) and may also protect the one or more underlying layers/structures. It is contemplated, however, that passivation layer 16 may be formed unevenly, such as according to unevenness of one or more underlying layers. In addition, passivation layer 16 may be formed of or include a transparent insulator to provide a resonance effect.

First pixel electrode 120, second pixel electrode 220, and third pixel electrode 320 of display apparatus 100 are disposed on passivation layer 16. Exemplary configurations of first pixel electrode 120, second pixel electrode 220, and third pixel electrode 320 are described in more detail in association with FIGS. 2 to 7.

Pixel definition layer 19 is disposed on first pixel electrode 120, second pixel electrode 220, third pixel electrode 320, and one or more exposed portions of passivation layer 16. Pixel definition layer 19 may be formed of any suitable material, such as an organic and/or inorganic material. It is noted that pixel definition layer 19 may a cover first pixel electrode 120, second pixel electrode 220, third pixel electrode 320, and passivation layer 16, but may also include openings that expose portions of first pixel electrode 120, second pixel electrode 220, and third pixel electrode 320, respectively.

First intermediate layer 130, second intermediate layer 230, and third intermediate layer 330 are respectively formed on first pixel electrode 120, second pixel electrode 220, and third pixel electrode 320. Exemplary configurations of first intermediate layer 130, second intermediate layer 230, and third intermediate layer 330 are described in more detail in association with FIGS. 2 to 6. Opposite electrode 40 is formed on first intermediate layer 130, second intermediate layer 230, and third intermediate layer 330. According to one or more exemplary embodiments, opposite electrode 40 may cover one or more exposed portions of pixel definition layer 19. Exemplary configurations of opposite electrode 40 are described in more detail in association with FIGS. 2 to 6.

In one or more exemplary embodiments, first pixel electrode 120, second pixel electrode 220, and third pixel electrode 320 may function as anode electrodes, and opposite electrode 40 may function as a cathode electrode. Polarities of first pixel electrode 120, second pixel electrode 220, third pixel electrode 320, and opposite electrode 40 may be reversed, e.g., opposite electrode 40 may function as an anode electrode and first pixel electrode 120, second pixel electrode 220, and third pixel electrode 320 may function as cathode electrodes. First pixel electrode 120, second pixel electrode 220, and third pixel electrode 320 may be respectively insulated from opposite electrode 40 via first intermediate layer 130, second intermediate layer 230, and third intermediate layer 330. It is noted that electroluminescent layers (or materials) of first intermediate layer 130, second intermediate layer 230, and third intermediate layer 330 may emit light according to applied voltage differences across the anode and cathode electrodes.

According to one or more exemplary embodiments, a unit pixel may include a plurality of sub-pixels, and the plurality of sub-pixels may emit various colors of light. For example, the plurality of sub-pixels may respectively emit red light, green light, and blue light, or may respectively emit red light, green light, blue light, and white light. It is contemplated, however, that any suitable color and/or groups of colors of light may be utilized in association with exemplary embodiments. Although a light-emitting material (or layer) may be separately formed in respective pixel/sub-pixel regions of first intermediate layer 130, second intermediate layer 230, and third intermediate layer 330, exemplary embodiments are not limited thereto or thereby. For instance, an common intermediate layer may be formed in common with a unit pixel, one or more sub-pixels of a unit pixel, or any combination of unit pixels and/or sub-pixels.

Although not illustrated, display apparatus 100 may further include a thin-film encapsulation layer and a protection layer formed on the thin-film encapsulation layer. For instance, the thin-film encapsulation layer may be stacked between the protection layer and substrate 10. The thin-film encapsulation layer may include a plurality of inorganic layers, or a stack of one or more inorganic layers and one or more organic layers. The protection layer may include a metallic oxide or nitride, such as SiNx, SiOxNy, titanium oxide (TiOx), titanium nitride (TiNx), titanium oxynitride (TiOxNy), ZrOx, tantalum nitride (TaNx), tantalum oxide (TaOx), hafnium oxide (HfOx), AlOx, etc. The protection layer may increase life expectancy of the thin-film encapsulation layer by obstructing (or at least reducing) contaminants (e.g., moisture, oxygen, etc.) from degrading the thin-film encapsulation layer.

Figure 2:
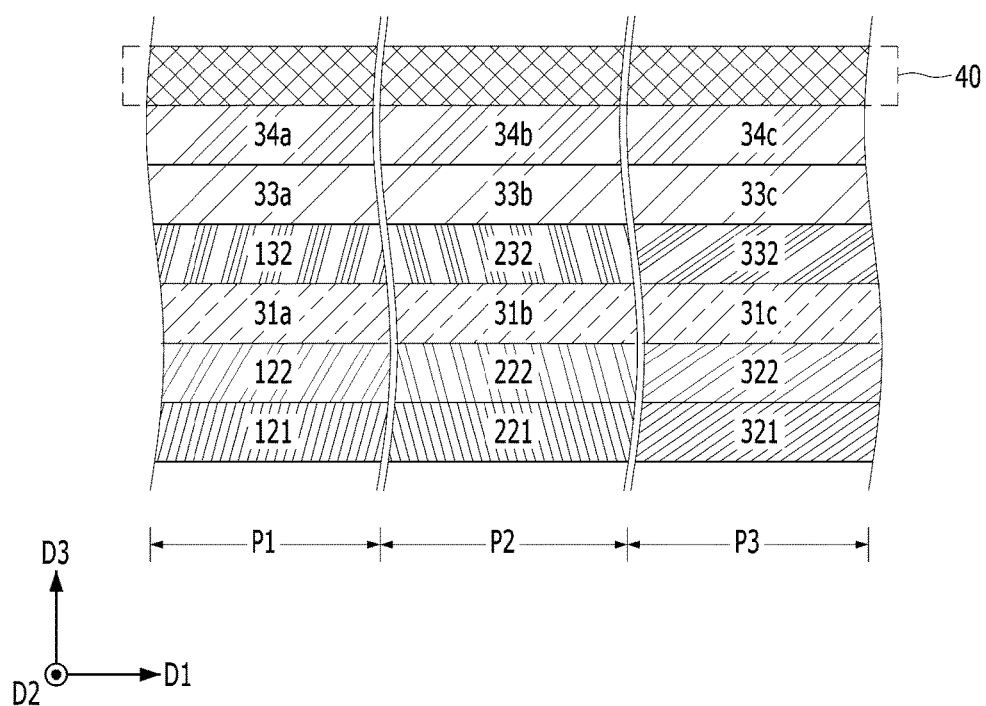
FIG. 2 is an enlarged schematic cross-sectional view of portions P1, P2, and P3 of the light-emitting display apparatus of FIG. 1, according to one or more exemplary embodiments.

FIG. 2 is an enlarged schematic cross-sectional view of portions P1, P2, and P3 of the light-emitting display apparatus of FIG. 1, according to one or more exemplary embodiments.

Referring to FIGS. 1 and 2, first pixel electrode 120, second pixel electrode 220, and third pixel electrode 320 are disposed respectively on first sub-pixel region PXL1, second sub-pixel region PXL2, and third sub-pixel region PXL3 of substrate 10. First pixel electrode 120 may include first reflective layer 121 and first transparent conductive layer 122. Second pixel electrode 220 may include second reflective layer 221 and second transparent conductive layer 222. Third pixel electrode 320 may include third reflective layer 321 and third transparent conductive layer 322. Although not illustrated, it is contemplated that first pixel electrode 120, second pixel electrode 220, and third pixel electrode 320 may include one or more additional layers, such as additional transparent conductive layers disposed between substrate 10 and first, second, and third reflective layers 121, 221, and 321.

First transparent conductive layer 122, second transparent conductive layer 222, and third transparent conductive layer 322 may include any suitable transparent (or at least translucent) conductive material, such as any suitable transparent conductive oxide, such as, for example, at least one of indium tin oxide (ITO), indium zinc oxide (IZO), zinc oxide (ZnO), indium oxide (In$_2$O$_3$), indium gallium oxide (IGO), aluminum zinc oxide (AZO), titanium oxide (TixOy), etc. It is also contemplated that one or more transparent conductive polymers (ICP) may be utilized in association with one or more exemplary embodiments, such as polyaniline (PANI), poly(3,4-ethylenedioxythiophene) poly(styrenesulfonate) (PEDOT:PSS), etc.

According to one or more exemplary embodiments, at least one of first transparent conductive layer 122, second transparent conductive layer 222, and third transparent conductive layer 322 may be formed of a different material than at least one other transparent conductive layer of first transparent conductive layer 122, second transparent conductive layer 222, and third transparent conductive layer 322. It is also contemplated that constituent materials of at least two of first transparent conductive layer 122, second transparent conductive layer 222, and third transparent conductive layer 322 may be the same; however, concentrations of the constituent materials and/or formation processes of first transparent conductive layer 122, second transparent conductive layer 222, and/or third transparent conductive layer 322 may be different. Differences in materials, constituent material concentrations, and/or formation processes may be utilized to affect performance (e.g., transmissivity, resistivity, etc.) of first transparent conductive layer 122, second transparent conductive layer 222, and/or third transparent conductive layer 322, as will become more apparent below.

First reflective layer 121, second reflective layer 221, and third reflective layer 321 may be formed of any suitable relatively high-reflective material, such as any suitable relatively high-reflective metal, e.g., gold, a gold alloy, silver, a silver alloy, aluminum, an aluminum alloy, etc. It is contemplated, however, that any other suitable material may be utilized in association with exemplary embodiments, such as, for instance, magnesium (Mg), platinum (Pt), palladium (Pd), nickel (Ni), neodymium (Nd), iridium (Ir), chromium (Cr), calcium (Ca), silicon (Si), sodium (Na), tungsten (W), etc., or alloys thereof.

According to one or more exemplary embodiments, at least one of first reflective layer 121, second reflective layer 221, and third reflective layer 321 may be formed of a different material than at least one other reflective layer of first reflective layer 121, second reflective layer 221, and third reflective layer 321. It is also contemplated that at least one of first reflective layer 121, second reflective layer 221, and third reflective layer 321 may include one or more apertures. Differences in materials, number of apertures, size of apertures, and/or pattern of apertures may be utilized to affect performance (e.g., reflectivity, etc.) of at least one of first reflective layer 121, second reflective layer 221, and third reflective layer 321, as will become more apparent below.

First intermediate layer 130, second intermediate layer 230, and third intermediate layer 330 are respectively disposed on first pixel electrode 120, second pixel electrode 220, and third pixel electrode 320. First intermediate layer 130 may include first electroluminescent layer 132. First intermediate layer 130 may further include at least one of hole injection layer (HIL) 31a, a hole transport layer (HTL) (not shown), electron transport layer (ETL) 33a, and electron injection layer (EIL) 34a. Second intermediate layer 230 may include second electroluminescent layer 232. Second intermediate layer 230 may further include at least one of hole injection layer (ETL) 31b, a hole transport layer (HTL) (not shown), electron transport layer (ETL) 33b, and electron injection layer (EIL) 34b. Third intermediate layer 330 may include third electroluminescent layer 332. Third intermediate layer 330 may further include at least one of hole injection layer (HIL) 31c, a hole transport layer (HTL) (not shown), electron transport layer (ETL) 33c, and electron injection layer (EIL) 34c. It is contemplated, however, that exemplary embodiments are not limited thereto or thereby. For instance, first intermediate layer 130, second intermediate layer 230, and/or third intermediate layer 330 may include various additional and/or alternative functional layers.

First electroluminescent layer 132, second electroluminescent layer 232, and third electroluminescent layer 332 may be formed of any suitable material(s), such as include a relatively small molecular or polymer material. The small molecular material may include, for example, tris(8-hydroxyquinoline)aluminum(III) (Alq3), anthracene, cyclo pentadiene, bis(10-hybroxybenzo[h]quinolinato)beryllium (BeBq2), tris(2-methyl-8-quinolinolato)aluminum(III) (ALMQ), bis(2-(2-hydroxyphenyl)benzoxazolate)zinc (Zn-PBO), 4-biphenyloxolato aluminum (bis~2-methyl-8-quinolmato)4-phenylphenolate (BAlq), DPVBi (4,4'-bis(2,2'-diphenylvinyl)-1,1'-biphenyl), BSA-2, 2PSP, etc., or combinations thereof. In one or more exemplary embodiments, first electroluminescent layer 132, second electroluminescent layer 232, and third electroluminescent layer 332 may be formed of Alq3. The polymer material may include, for instance, polyphenylene (PPP) and/or a derivative thereof, poly pphenylenevinylene (PPV) and/or a derivative thereof, polythiophene (PT) and/or a derivative thereof, etc.

In one or more exemplary embodiments, first electroluminescent layer 132 may be configured to emit light in a first range of wavelengths, second electroluminescent layer 232 may be configured to emit light in a second range of wavelengths, and third electroluminescent layer 332 may be configured to emit light in a third range of wavelengths. For example, the first range of wavelengths may correspond to a range of red light wavelengths, the second range of wavelengths may correspond to a range of green light wavelengths, and the third range of wavelengths may correspond to a range of blue light wavelengths. It is contemplated, however, that one or more additional and/or alternative ranges of wavelengths may be utilized in association with exemplary embodiments. It is also contemplated that first electroluminescent layer 132, second electroluminescent layer 232, and third electroluminescent layer 332 may be configured to emit light in any suitable range of wavelengths depending on an applied voltage.

Hole injection layers 31a, 31b, and 31c may include any suitable material, such as, for example, copper phthalocyanine (CuPc), PEDOT, 4,4',4"-Tris(N-3-methylphenyl-N-phenyl-amino)triphenylamine (m-MTDATA), triphenylamine, etc. The hole transport layers may include at least one hole transport compound, such as, for example, aromatic tertiary amine. The aromatic tertiary amine may include at least one trivalent nitrogen atom combined only to carbon atoms (at least one of the carbon atoms may be an element of an aromatic ring). In one or more exemplary embodiments, the aromatic tertiary amine may be arylamine, such as, for instance, monoarylamine, diarylamine, triarylamine, polymeric arylamine, etc.

Electron transport layers 33a, 33b, and 33c may include any suitable material, such as a metal-chelated oxynoide compound including an oxygen-containing chelate, which may be referred to as "8-quinolinol" or "8-hydroxy quinolone." Compounds of electron transport layers 33a, 33b, and 33c may facilitate electron injection and transport, as well as provide relatively high performance. It is noted that butadiene derivatives and/or heterocyclic optical brighteners may be contained in electron transport materials of electron transport layers 33a, 33b, and 33c. It is also contemplated that benzazole and/or triazine may be utilized in association with electron transport layers 33a, 33b, and 33c.

Opposite electrode 40 is disposed on first intermediate layer 130, second intermediate layer 230, and third intermediate layer 330. Opposite electrode 40 may include a transparent conductive electrode, such as ITO, IZO, ZnO, In2O3, AZO, TixOy, and/or a transmissive electrode that can transmit light, such as a thin-film of Mg, Ag, Al, Ca, etc., and/or alloys thereof. It is also contemplated that one or more transparent conductive polymers (ICP) may be utilized in association with exemplary embodiments, such as PANI, PEDOT:PSS, etc. In one or more exemplary embodiments, materials forming opposite electrode 40 may be the same as (or different from) materials forming at least one of first transparent conductive layer 122, second transparent conductive layer 222, and third transparent conductive layer 322.

As mentioned, performance (e.g., transmissivity, resistivity, reflectivity, etc.) of one or more transparent conductive layers and/or one or more reflective layers of at least one of first pixel electrode 120, second pixel electrode 220, and third pixel electrode 320 may be modified in association with one or more exemplary embodiments. Performance modification may be utilized to improve (e.g., reduce) color shift between pixels (or sub-pixels) that might otherwise occur with variations in viewing angles of an observer, as well as used to increase display quality and efficiency despite variations in the viewing angles. It is noted that exemplary performance modifications to improve color shift, display quality, and/or efficiency of a light-emitting display apparatus will be described in more detail in association with FIGS. 3 to 7.

FIGS. 3, 4, 5, and 6 are schematic cross-sectional views of portions of light-emitting display apparatuses, according to one or more exemplary embodiments. The light-emitting displays of FIGS. 3 to 6 are similar to display apparatus 100 of FIGS. 1 and 2. As such, duplicative descriptions are primarily omitted to avoid obscuring exemplary embodiments.

Figure 3:
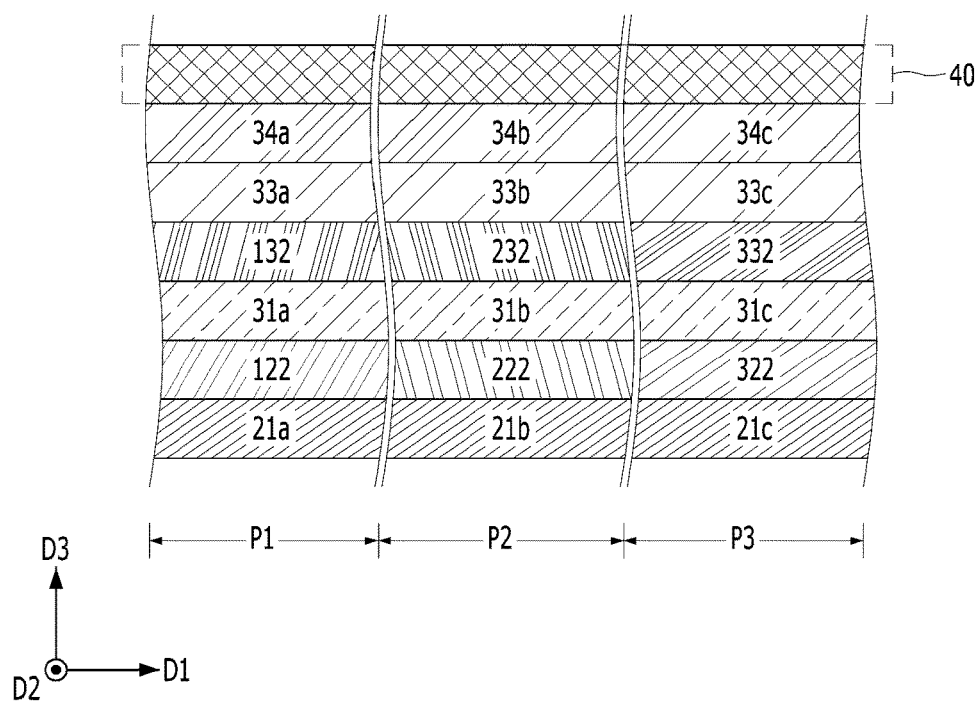
FIGS. 3, 4, 5, and 6 are schematic cross-sectional views of portions of light-emitting display apparatuses, according to one or more exemplary embodiments.

With reference to FIGS. 1 and 3, first pixel electrode 120, second pixel electrode 220, and third pixel electrode 320 are disposed respectively on first sub-pixel region PXL1, second sub-pixel region PXL2, and third sub-pixel region PXL3 of substrate 10. First pixel electrode 120, second pixel electrode 220, and third pixel electrode 320 may respectively include first transparent conductive layer 122, second transparent conductive layer 222, and third transparent conductive layer 322. First pixel electrode 120, second pixel electrode 220, and third pixel electrode 320 may further include first reflective layer 21a, second reflective layer 21b, and third reflective layer 21c, respectively. First reflective layer 21a may correspond to first reflective layer 121, second reflective layer 21b may correspond to second reflective layer 221, and third reflective layer 21c may correspond to third reflective layer 321. It is contemplated, however, that at least one of first reflective layer 21a, second reflective layer 21b, and third reflective layer 21c may correspond to a corresponding reflective layer described in association with at least one of FIGS. 5, 6, and 7.

In one or more exemplary embodiments, first electroluminescent layer 132 may be configured to emit light in a first range of wavelengths, second electroluminescent layer 232 may be configured to emit light in a second range of wavelengths, and third electroluminescent layer 332 may be configured to emit light in a third range of wavelengths. The first, second, and third ranges of wavelengths may be different than one another, and, as such, as the viewing angle of an observer changes (e.g., increases), respective changes in luminance and/or respective shifts in color of first sub-pixel region PXL1, second sub-pixel region PXL2, and third sub-pixel region PXL3 may be different than one another. Observers may recognize these differences (or changes), and, as such, at least display quality may be reduced.

According to one or more exemplary embodiments, modifying transmittance of one or more transparent conductive layers of at least one of first pixel electrode 120, second pixel electrode 220, and third pixel electrode 320, and/or modifying reflectance of one or more reflective layers of at least one of first pixel electrode 120, second pixel electrode 220, and third pixel electrode 320 may be utilized to reduce color shift, increase efficiency, and improve display quality despite changes in viewing angles. For instance, modification in transmittance and/or reflectance may be used in association with the emission of relatively longer wavelengths of light, such as red light and/or green light, to improve color shift characteristics, efficiency, and/or display quality. It is contemplated, however, that exemplary embodiments are not limited thereto or thereby. For instance, modification in transmittance and/or reflectance may be utilized in association with other wavelengths of light, such as blue light, white light, etc.

Figure 4:
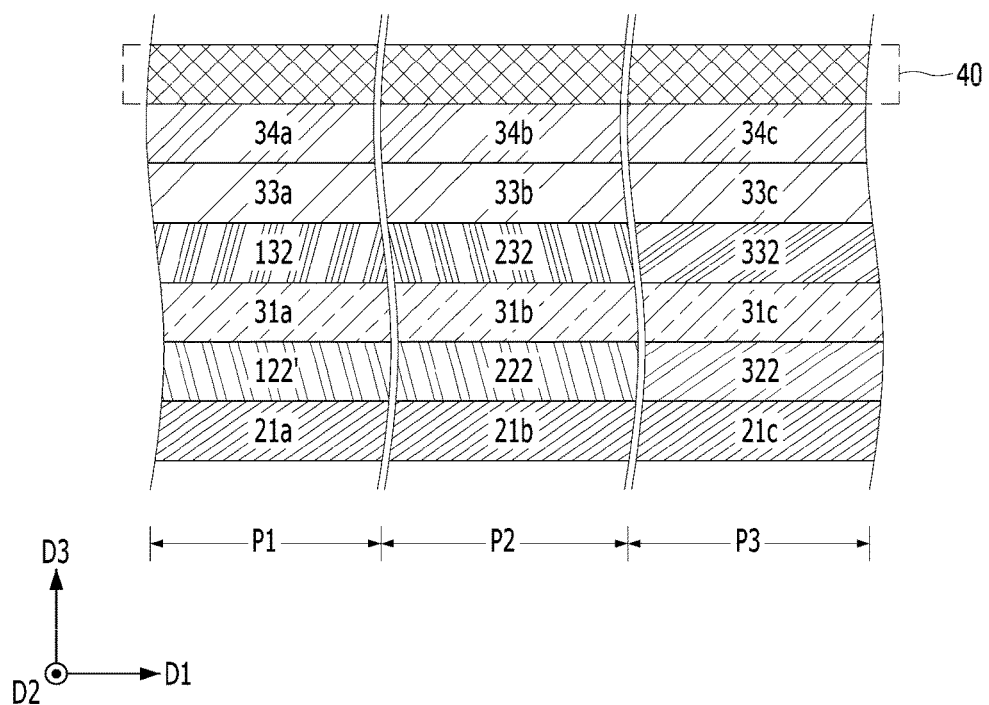

According to one or more exemplary embodiments, first transparent conductive layer 122 may have a different (e.g., smaller) transmittance than second transparent conductive layer 222, and second transparent conductive layer 222 may have a different (e.g., smaller) transmittance than third transparent conductive layer 322. In one or more exemplary embodiments, first transparent conductive layer 122 may have the same (or substantially the same) transmittance as second transparent conductive layer 222, and third transparent conductive layer 322 may have a different (e.g., larger) transmittance than first transparent conductive layer 122 and second transparent conductive layer 222, such as illustrated in association with the light-emitting display apparatus of FIG. 4. That is, FIG. 4 illustrates a light-emitting display apparatus including first transparent conductive layer 122' having the same transmittance as second transparent conductive layer 222. Other than the difference in transmittance of first transparent conductive layer 122', and, thereby, one or more differences in the features of first transparent conductive layer 122', the light-emitting display apparatus of FIG. 4 may be the same as the light-emitting display apparatus of FIG. 3.

Adverting back to FIGS. 1 and 3, first transparent conductive layer 122, second transparent conductive layer 222, and third transparent conductive layer 322 may be formed (e.g., deposited) via any suitable manufacturing technique, such as one or more chemical vapor deposition, physical vapor deposition, plasma processing, sputtering, ion plating, epitaxy, thermal oxidation, etc., processes, and/or one or more hybrid processes thereof, e.g., hybrid physical-chemical vapor deposition processes. In this manner, a transparent conductive layer to be formed with a smaller transmittance may be formed utilizing less oxygen in association with one or more manufacturing processes to form the transparent conductive layer (or a material of the transparent conductive layer may be formed to include a smaller concentration of oxygen).

For example, in a chemical vapor deposition process, substrate 10 including one or more elements formed thereon may be disposed inside a reactor in which a number of gasses including oxygen may be supplied. A chemical reaction may occur between the gasses including the oxygen to condense a material on a surface of the one or more elements formed on substrate 10. In this manner, the oxygen concentration may be controlled to affect the transmittance of an associated transparent conductive layer being formed. To this end, the concentration of oxygen in (or associated with) at least one of first transparent conductive layer 122, second transparent conductive layer 222, and third transparent conductive layer 322 may be different, and, as such, the difference(s) may affect the light transmissivity of first transparent conductive layer 122, second transparent conductive layer 222, and/or third transparent conductive layer 322.

According to one or more exemplary embodiments, first transparent conductive layer 122 may have a different (e.g., greater) resistivity than second transparent conductive layer 222, and second transparent conductive layer 222 may have a different (e.g., greater) resistivity than third transparent conductive layer 322. In one or more exemplary embodiments, first transparent conductive layer 122 may have the same (or substantially the same) resistivity as second transparent conductive layer 222, and third transparent conductive layer 322 may have a different (e.g., smaller) resistivity than first transparent conductive layer 122 and second transparent conductive layer 222. It is noted that the resistivity (e.g., sheet resistance) of a transparent conductive layer may increase as the oxygen concentration is reduced. Other than differences in concentrations of oxygen, the constituent materials of first transparent conductive layer 122, second transparent conductive layer 222, and third transparent conductive layer 322 may be equivalent (or substantially equivalent).

In one or more exemplary embodiments, constituent materials of first transparent conductive layer 122, second transparent conductive layer 222, and/or third transparent conductive layer 322 may be modified to alter the transmittance and/or resistivity of at least one of first transparent conductive layer 122, second transparent conductive layer 222, and third transparent conductive layer 322. For example, constituent materials of first transparent conductive layer 122 may cause, at least in part, a first transmittance and/or a first resistivity in association with first pixel electrode 120, constituent materials of second transparent conductive layer 222 may cause, at least in part, a second transmittance and/or a second resistivity in association with second pixel electrode 220, and constituent materials of third transparent conductive layer 322 may cause, at least in part, a third transmittance and/or a third resistivity in association with third pixel electrode 320. For instance, the first transmittance may be different (e.g., smaller) than the second transmittance, which may be different (e.g., smaller) than the third transmittance. In this manner, the first resistivity may be different (e.g., greater) than the second resistivity, which may be different (e.g., greater) than the third resistivity. As another example, the first transmittance may be equivalent (or substantially equivalent) to the second transmittance, and the third transmittance may be different (e.g., greater) than the first transmittance and the second transmittance. In this manner, the first resistivity may be equivalent (or substantially equivalent) to the second resistivity that may be different (e.g., greater) than the third resistivity.

Figure 5:
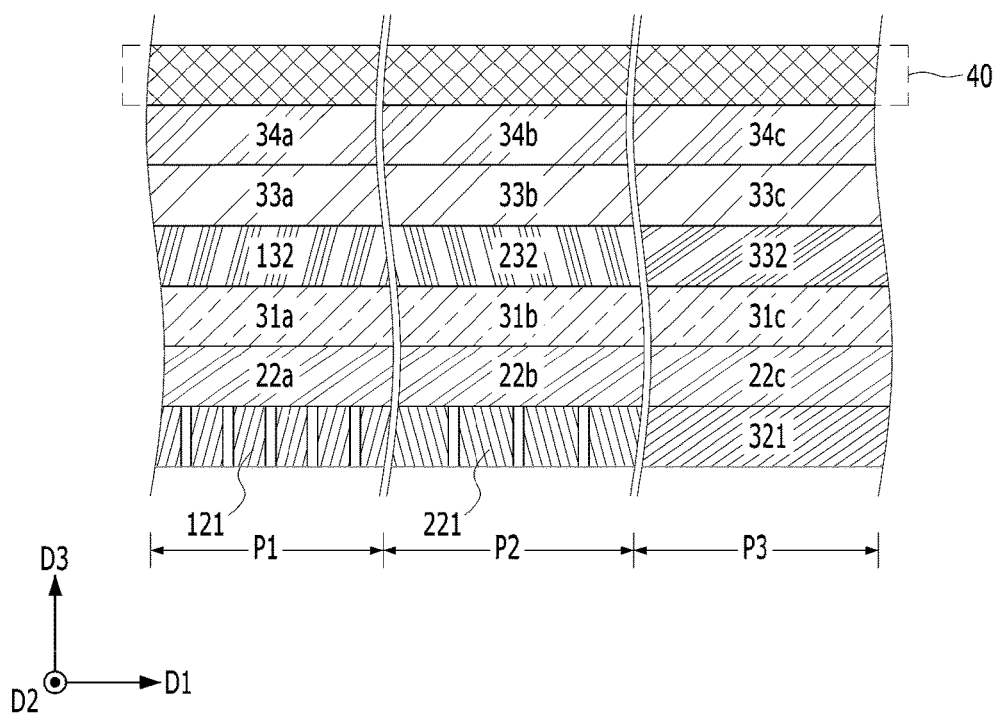

With reference to FIGS. 1 and 5, first pixel electrode 120, second pixel electrode 220, and third pixel electrode 320 are disposed respectively on first sub-pixel region PXL1, second sub-pixel region PXL2, and third sub-pixel region PXL3 of substrate 10. First pixel electrode 120, second pixel electrode 220, and third pixel electrode 320 may respectively include first transparent conductive layer 22a, second transparent conductive layer 22b, and third transparent conductive layer 22c. First transparent conductive layer 22a may correspond to first transparent conductive layer 122, second reflective layer 22b may correspond to second transparent conductive layer 222, and third transparent conductive layer 22c may correspond to third transparent conductive layer 322. It is contemplated, however, that at least one of first transparent conductive layer 22a, second transparent conductive layer 22b, and third transparent conductive layer 22c may correspond to an associated transparent conductive layer described with reference to at least one of FIGS. 3 and 4. First pixel electrode 120, second pixel electrode 220, and third pixel electrode 320 may further include first reflective layer 121, second reflective layer 221, and third reflective layer 321, respectively.

In one or more exemplary embodiments, first electroluminescent layer 132 may be configured to emit light in a first range of wavelengths, second electroluminescent layer 232 may be configured to emit light in a second range of wavelengths, and third electroluminescent layer 332 may be configured to emit light in a third range of wavelengths. The first, second, and third ranges of wavelengths may be different than one another, and, as such, as the viewing angle of an observer changes (e.g., increases), respective changes in luminance and/or respective shifts in color of first sub-pixel region PXL1, second sub-pixel region PXL2, and third sub-pixel region PXL3 may be different than one another. Observers may recognize these differences (or changes), and, as such, at least display quality may be reduced.

As previously mentioned, modifying transmittance of one or more transparent conductive layers of at least one of first pixel electrode 120, second pixel electrode 220, and third pixel electrode 320, and/or modifying reflectance of one or more reflective layers of at least one of first pixel electrode 120, second pixel electrode 220, and third pixel electrode 320 may be utilized to reduce color shift, increase efficiency, and improve display quality despite changes in viewing angles. For instance, modification in transmittance and/or reflectance may be used in association with the emission of relatively longer wavelengths of light, such as red light and/or green light, to improve color shift characteristics, efficiency, and/or display quality. It is contemplated, however, that exemplary embodiments are not limited thereto or thereby. For instance, modification in transmittance and/or reflectance may be utilized in association with other wavelengths of light, such as blue light, white light, etc.

According to one or more exemplary embodiments, reflectance of at least one of first reflective layer 121, second reflective layer 221, and third reflective layer 321 may be modified via differences in materials and/or formation of one or more apertures in association with first reflective layer 121, second reflective layer 221, and/or third reflective layer 321. In this manner, the number of apertures, the size of apertures, and/or the arrangement of apertures respectively formed in association with first reflective layer 121, second reflective layer 221, and/or third reflective layer 321 may be selected to provide a corresponding level of reflectivity that may be further modified via differences in material selections. For instance, as the number of apertures formed in a reflective layer increases, the reflectivity of the reflective layer may decrease. Although certain numbers of apertures are illustrated in the accompanying drawings, any suitable number of apertures may be utilized in association with exemplary embodiments.

In one or more exemplary embodiments, the one or more apertures may be formed via any suitable technique, such as via one or more wet and/or dry etching techniques. It is also noted that the one or more apertures may have any suitable cross-sectional shape, such as a circular shape, an ovular shape, a triangular shape, a square shape, a rectangular shape, etc. In other words, the one or more apertures may appear, in a plan view, having a circular shape, an ovular shape, a triangular shape, a square shape, a rectangular shape, and/or the like shape. As such, the one or more apertures may have the same cross-sectional shape or at least one aperture of the one or more apertures may have a different cross-sectional shape than at least one other aperture of the one or more apertures. Further, the one or more apertures may have the same size as one another or at least one aperture of the one or more apertures may have a different size than at least one other aperture of the one or more apertures. As such, first reflective layer 121, second reflective layer 221, and third reflective layer 321 may be considered as including (or being associated with) a total aperture area, e.g., an aggregate amount of surface area occupied by the aperture(s) formed in an associated reflective layer. As the total aperture area increases, the reflectivity of an associated reflective layer may decrease.

According to one or more exemplary embodiments, first reflective layer 121 and second reflective layer 221 may include respective pluralities of apertures. Third reflective layer 321, however, may have a continuous plate-shape configuration, e.g., third reflective layer 321 may be free of apertures. The number of apertures formed in first reflective layer 121 may be different (e.g., greater) than the number of apertures formed in second reflective layer 221. For instance, first reflective layer 121 may include four apertures, and second reflective layer 122 may include one aperture; however, as previously mentioned, any suitable number of apertures may be utilized in association with exemplary embodiments. In one or more exemplary embodiments, the number of apertures formed in first reflective layer 121 may be the same as the number of apertures formed in second reflective layer 221, such as illustrated in association with the light-emitting display apparatus of FIG. 6. That is, FIG. 6 illustrates a light-emitting display apparatus including first reflective layer 121' having the same number of apertures as the number of apertures formed in second reflective layer 221.

Adverting back to FIGS. 1 and 5, a total aperture area of first reflective layer 121 may be different (e.g., larger) than a total aperture area of second reflective layer 221. It is also contemplated that the total aperture area of first reflective layer 121 may be the same as the total aperture area of second reflective layer 221, such as illustrated in association with the light-emitting display apparatus of FIG. 6. That is, FIG. 6 illustrates a light-emitting display apparatus including first reflective layer 121' having the same (or substantially the same) total aperture area as second reflective layer 221. Other than differences in the number of apertures and the total aperture area of first reflective layer 121', the light-emitting display apparatus of FIG. 6 is the same as (or similar to) the light-emitting display apparatus of FIG. 5.

Figure 6:
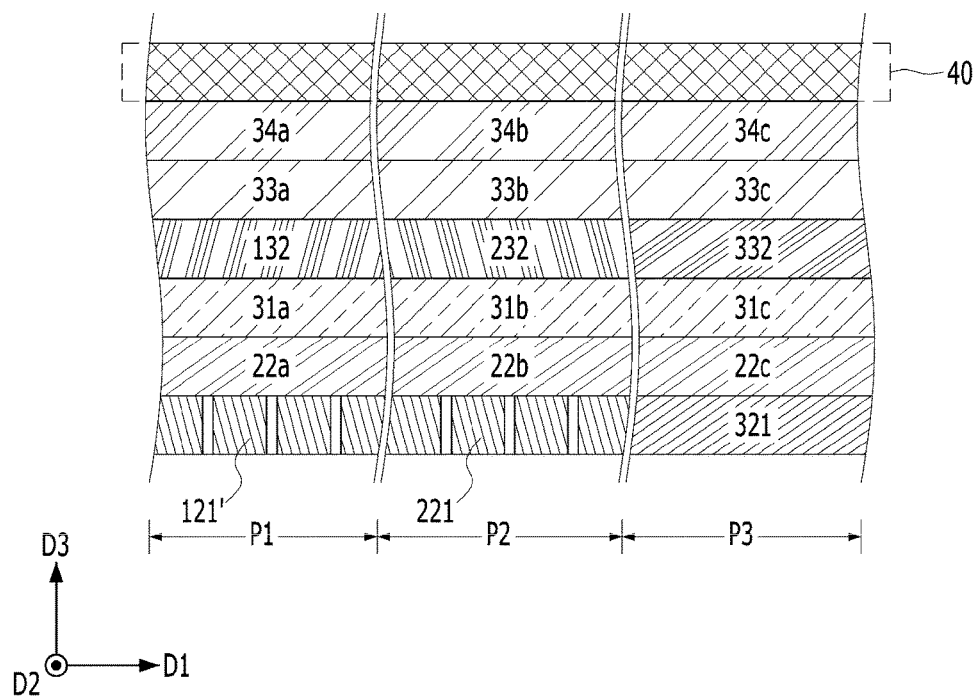

With reference to FIGS. 1, 5, and 6, based on differences in the total number of apertures, the configuration of apertures, the arrangement of apertures, and/or the total aperture area of a reflective layer, first reflective layer 121 may have the same or different (e.g., lower) reflectance than second reflective layer 221, and second reflective layer 221 may have a different (e.g., lower) reflectance than third reflective layer 321. As previously mentioned, the differences in reflectivity may be additionally (or alternatively) achieved via one or more differences in materials of first reflective layer 121, second reflective layer 221, and/or third reflective layer 321. In one or more exemplary embodiments, first reflective layer 121' may have the same reflectance as the reflectance of second reflective layer 221, and third reflective layer 321 may have a different (e.g., greater) reflectance than the reflectance of first reflective layer 121' and the reflectance of second reflective layer 221.

According to one or more exemplary embodiments, modifying transmittance of one or more transparent conductive layers of at least one of first pixel electrode 120, second pixel electrode 220, and third pixel electrode 320, and/or modifying reflectance of one or more reflective layers of at least one of first pixel electrode 120, second pixel electrode 220, and third pixel electrode 320 may be utilized in one or more combinations to reduce color shift, improve display quality, and/or increase efficiency despite changes in viewing angle. For instance, a combination of modifications in transmittance and/or reflectance may be used in association with the emission of relatively longer wavelengths of light, such as red light and/or green light, to improve color shift characteristics, display quality, and efficiency. Exemplary embodiments, however, are not limited thereto or thereby. For instance, a combination of modifications in transmittance and/or reflectance may also be utilized in association with other wavelengths of light, e.g., blue light, white light, etc.

Figure 7:
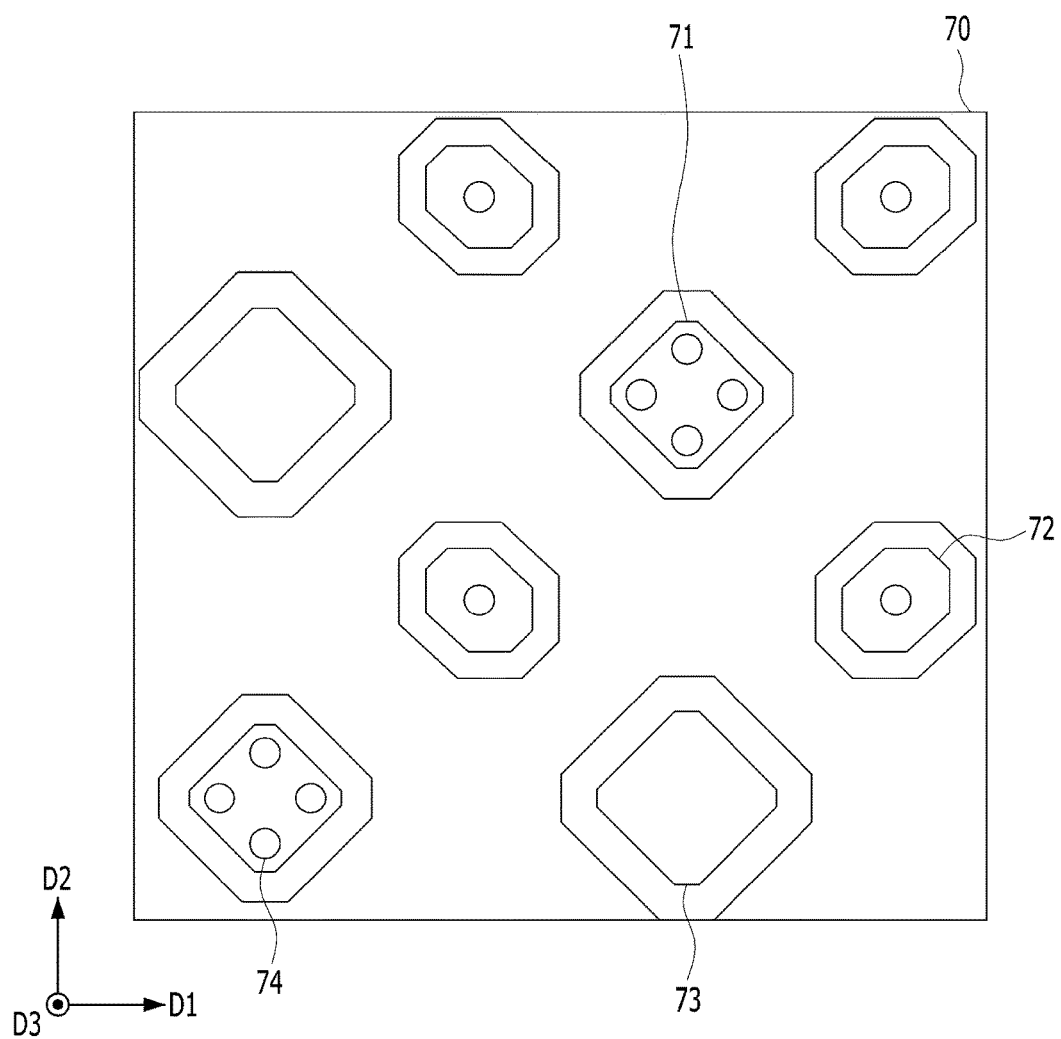
FIG. 7 is a schematic plan view of a reflective layer of a portion of a light-emitting display apparatus, according to one or more exemplary embodiments.

FIG. 7 is a schematic plan view of a reflective layer of a portion of a light-emitting display apparatus, according to one or more exemplary embodiments.

With reference to FIG. 7, a portion 70 of a light-emitting display apparatus may include any suitable arrangement of pixels configured to emit light of a determined color, such as any suitable arrangement of red, green, and blue pixels, e.g., red pixel 71, green pixel 72, and blue pixel 73. For instance, red pixel 71, green pixel 72, and blue pixel 73 may be arranged in a pentile matrix with a plurality of other pixels. An aperture 74 or a plurality of apertures may be formed in the respective reflective layers of red pixel 71 and green pixel 72. Blue pixel 73 may be free of apertures. Although apertures of FIG. 7 are shown having the same circular shape and the same cross-sectional area, exemplary embodiments are not limited thereto or thereby. In other words, any suitable shape(s) and/or size(s) of apertures may be utilized in association with exemplary embodiments.

According to one or more exemplary embodiments, four apertures are formed in the reflective layer of red pixel 71, one aperture is formed in the reflective layer of green pixel 72, and no apertures are formed in the reflective layer of blue pixel 73. The size of each aperture formed in the reflective layer of red pixel 71 and the reflective layer of green pixel 72 may be the same (or substantially the same) as one another. In one or more exemplary embodiments, the apertures formed in the reflective layer of red pixel 71 may cover about 17% of the surface area of the reflective layer of red pixel 71, and the aperture formed in the reflective layer of green pixel 72 may cover about 10% of the surface area of the reflective layer of green pixel 72. In this manner, the differences in total aperture area may enable the reflective layer of red pixel 71 have about 83% relative reflectance with respect to the reflectance of the reflective layer of blue pixel 73, and the reflective layer of green pixel 72 to have about 90% relative reflectance with respect to the reflectance of the reflective layer of blue pixel 73.

Figure 8:
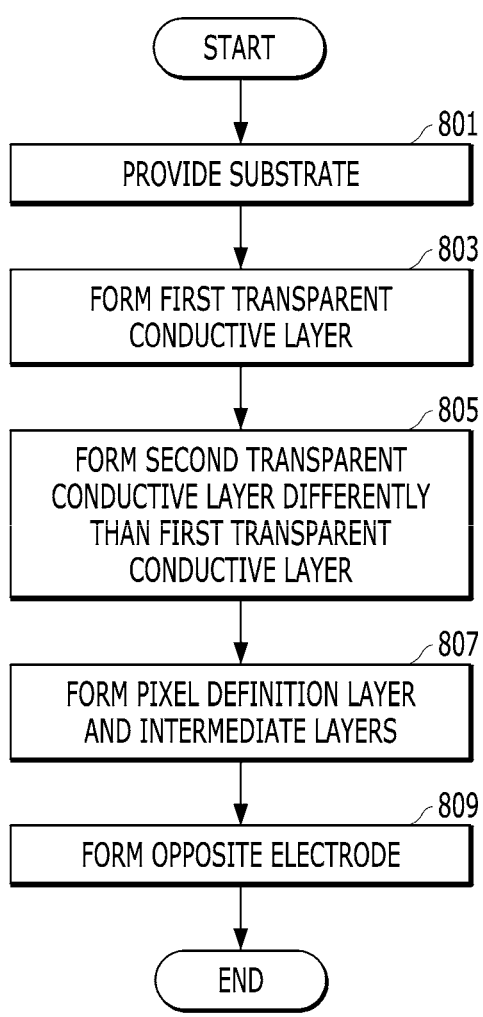
FIG. 8 is a flowchart of a process for forming a light-emitting display apparatus including pixel electrodes with transparent conductive layers having various oxygen densities, according to one or more exemplary embodiments.

FIG. 8 is a flowchart of a process for forming a light-emitting display apparatus including pixel electrodes with transparent conductive layers having various oxygen densities, according to one or more exemplary embodiments. For convenience, the process of FIG. 8 will be described in association with FIGS. 1 and 4, and, thereby, in association with first transparent conductive layer 122' having a same oxygen concentration, a same resistivity, and a same transmittance as second transparent conductive layer 222. Also, the constituent materials of first transparent conductive layer 122', second transparent conductive layer 222, and third transparent conductive layer 322 are assumed to be the same as one another.

In step 801, substrate 10 is provided. Substrate 10 may include one or more layers (or structures) formed thereon, such as buffer layer 11, first thin-film transistor TFT1, second thin-film transistor TFT2, third thin-film transistor TFT3, passivation layer 16, first reflective layer 21a, second reflective layer 21b, and third reflective layer 21c.

At step 803, a first transparent conductive layer is formed via any suitable first method (e.g., one or more sputtering and photolithographic patterning processes) in associated with various pixel regions, such as various first sub-pixel regions PXL1 (e.g., red sub-pixel regions) and various second sub-pixel regions PXL2 (e.g., various green sub-pixel regions). The first method may include formation of first transparent conductive layer 122' on first reflective layer 21a and second transparent conductive layer 222 on second reflective layer 21b according to one or more first processing conditions that causes, at least in part, first transparent conductive layer 122' and second transparent conductive layer 222 to be associated with a first oxygen concentration, a first resistivity, and a first transmittance.

A second transparent conductive layer is formed via any suitable second method (e.g., one or more sputtering and photolithographic patterning processes) in associated with various pixel regions, such as various third sub-pixel regions PXL3 (e.g., blue sub-pixel regions), per step 805. The second method may include formation of third transparent conductive layer 322 on third reflective layer 21c according to one or more second processing conditions that causes, at least in part, third transparent conductive layer 322 to be associated with a second oxygen concentration, a second resistivity, and a second transmittance, each of which is respectively different than the first oxygen concentration, the first resistivity, and the first transmittance. For example, the one or more second processing conditions may include a lower oxygen concentration than the one or more first processing conditions that causes, at least in part, third sub-pixel regions PXL3 to have higher transmittance and lower resistivity than first sub-pixel regions PXL1 and second sub-pixel regions PXL2.

In step 807, pixel definition layer 19 is formed via any suitable manufacturing technique, and first intermediate layer 130, second intermediate layer 230, and third intermediate layer 330 are respectively formed on first transparent conductive layer 122', second transparent conductive layer 222, third transparent conductive layer 322, and portions of pixel definition layer 19 via any suitable manufacturing technique, e.g., via one or more vacuum deposition, spin coating, inkjet printing, doctor blading, laser induced thermal imaging (LITI), and/or the like techniques. At step 809, opposite electrode 40 is formed on first intermediate layer 130, second intermediate layer 230, third intermediate layer 330, and exposed portions of pixel definition layer 19 via any suitable manufacturing technique, e.g., vacuum deposition. Although not illustrated, an encapsulation layer may be formed on opposite electrode 40 via any suitable manufacturing technique, e.g., via vacuum deposition. Also, a protection layer (not shown) may be formed on the encapsulation layer.

Figure 9:
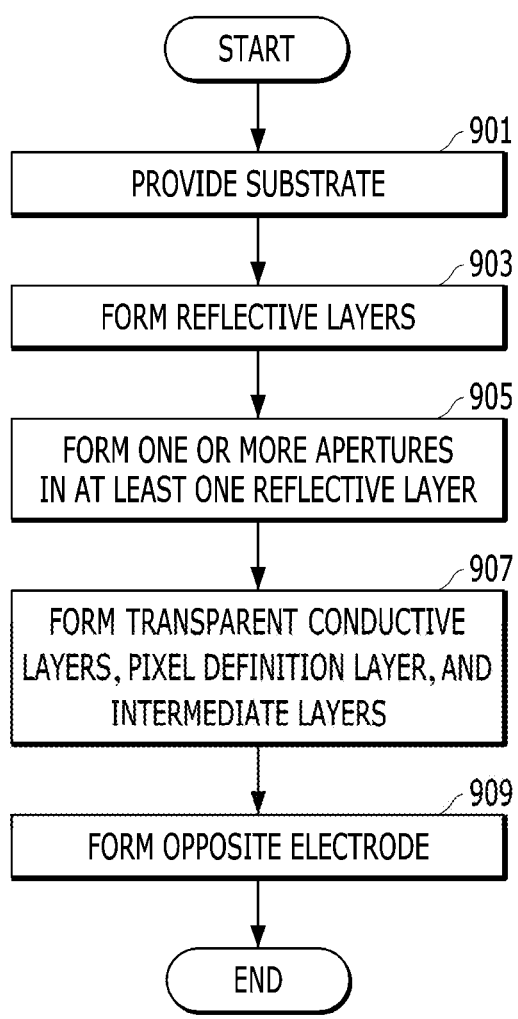
FIG. 9 is a flowchart of a process for forming a light-emitting display apparatus including pixels with reflective layers having different aperture patterns, according to one or more exemplary embodiments.

FIG. 9 is a flowchart of a process for forming a light-emitting display apparatus including pixels with reflective layers having different aperture patterns, according to one or more exemplary embodiments. For convenience, the process of FIG. 9 will be described in association with FIGS. 1, 5, and 7, and, thereby, in association with first reflective layer 121 having a different pattern of apertures than second reflective layer 221, and, thereby, a different total aperture area and different reflectivity. The constituent materials of first reflective layer 121, second reflective layer 221, and third reflective layer 321 are assumed to be the same.

In step 901, substrate 10 is provided. Substrate 10 may include one or more layers (or structures) formed thereon, such as buffer layer 11, first thin-film transistor TFT1, second thin-film transistor TFT2, third thin-film transistor TFT3, and passivation layer 16. At step 903, respective patterns of first reflective layers 121, second reflective layers 221, and third reflective layers 321 are formed via any suitable technique, e.g., via sputtering, in first sub-pixel regions PXL1 (e.g., red sub-pixel regions), second sub-pixel regions PXL2 (e.g., green sub-pixel regions), and third sub-pixel regions PXL3 (e.g., blue sub-pixel regions).

A plurality of apertures is formed in association with first reflective layers 121 and second reflective layers 221 via any suitable manufacturing technique, e.g., one or more etching techniques, per step 905. In one or more exemplary embodiments, first reflective layers 121 each include more apertures than second reflective layers 221. For instance, first reflective layers 121 include four apertures, such as illustrated in association with red pixel 71 of FIG. 7, and second reflective layers 221 include one aperture, such as illustrated in association with green pixel 72 of FIG. 7. No apertures are formed in association with third reflective layers 321, such as illustrated in association with blue pixel 73 of FIG. 7. In this manner, each first reflective layer 121 may have a larger total aperture area than each second reflective layer 221. The difference in total aperture area may enable first reflective layers 121 to have about 83% relative reflectance with respect to the reflectance of third reflective layers 321, and second reflective layers 221 to have about 90% relative reflectance with respect to the reflectance of third reflective layers 321.

In step 907, first transparent conductive layers 22a, second transparent conductive layers 22b, and third transparent conductive layers 22c are respectively formed on first reflective layers 121, second reflective layers 221, and third reflective layers 321 via any suitable one or more manufacturing techniques. In one or more exemplary embodiments, first transparent conductive layers 22a, second transparent conductive layers 22b, and third transparent conductive layers 22c may be formed similarly or at least one of first transparent conductive layers 22a, second transparent conductive layers 22b, and third transparent conductive layers 22c may be formed differently, such as formed in association with the process of FIG. 8. A remainder of step 907 and step 909 may be the same as described in association with FIG. 8, and, as such, duplicative descriptions are omitted to avoid obscuring exemplary embodiments.

According to one or more exemplary embodiments, a light-emitting display apparatus that improves efficiency, display quality, and color shift characteristics despite changes in viewing angle may be provided via differences in transmittances of various transparent conductive layers of pixels and/or via differences in reflectivity of various reflective layers of the pixels.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A light-emitting display apparatus, comprising:
a substrate comprising a first region adjacent to a second region;
a first pixel electrode overlapping the first region, the first pixel electrode comprising a first transparent conductive layer;
a second pixel electrode overlapping the second region, the second pixel electrode comprising a second transparent conductive layer;
a first electroluminescent layer disposed on the first pixel electrode, the first electroluminescent layer being configured to emit light in a first range of wavelengths; and
a second electroluminescent layer disposed on the second pixel electrode, the second electroluminescent layer being configured to emit light in a second range of wavelengths different from the first range of wavelengths,
wherein resistivity of the first transparent conductive layer is different from resistivity of the second transparent conductive layer.

2. The light-emitting display apparatus of claim 1, wherein transmittance of the first transparent conductive layer is different from transmittance of the second transparent conductive layer.

3. The light-emitting display apparatus of claim 1, wherein constituent materials of the first transparent conductive layer are equivalent to constituent materials of the second transparent conductive layer.

4. The light-emitting display apparatus of claim 1, wherein an oxygen content of the first transparent conductive layer is different from an oxygen content of the second transparent conductive layer.

5. The light-emitting display apparatus of claim 1, wherein transmittance of materials of the first transparent conductive layer is different from transmittance of materials of the second transparent conductive layer.

6. The light-emitting display apparatus of claim 5, wherein the first transparent conductive layer comprises at least one of indium zinc oxide (IZO) and aluminum zinc oxide (AZO).

7. The light-emitting display apparatus of claim 1, wherein the resistivity comprises sheet resistance.

8. The light-emitting display apparatus of claim 1, further comprising:
a third pixel electrode overlapping the first region of the substrate, the third pixel electrode comprising a third transparent conductive layer; and
a third electroluminescent layer disposed on the third pixel electrode, the third electroluminescent layer being configured to emit light in a third range of wavelengths different from the first range of wavelengths and the second range of wavelengths,
wherein resistivity of the third transparent conductive layer and resistivity of the first transparent conductive layer are substantially the same.

9. The light-emitting display apparatus of claim 8, wherein transmittance of the third transparent conductive layer and transmittance of the first transparent conductive layer are substantially the same.

10. The light-emitting display apparatus of claim 8, wherein:
the first region comprises a red pixel and a green pixel; and
the second region comprises a blue pixel.

11. The light-emitting display apparatus of claim 1, further comprising:
a third pixel electrode overlapping a third region of the substrate, the third pixel electrode comprising a third transparent conductive layer; and
a third electroluminescent layer disposed on the third pixel electrode, the third electroluminescent layer being configured to emit light in a third range of wavelengths different from the first range of wavelengths and the second range of wavelengths,
wherein the third region is adjacent to the first region and the second region, and
wherein resistivity of the third transparent conductive layer is different from resistivity of the first transparent conductive layer and resistivity of the second transparent conductive layer.

12. The light-emitting display apparatus of claim 11, wherein transmittance of the third transparent conductive layer is different from transmittance of the first transparent conductive layer and transmittance of the second transparent conductive layer.

13. The light-emitting display of claim 11, wherein:
the first region comprises a red pixel;
the second region comprises a green pixel; and
the third region comprises a blue pixel.

14. The light-emitting display apparatus of claim 1, wherein:
the first pixel electrode further comprises a first reflective layer disposed between the first transparent conductive layer and the substrate; and
the second pixel electrode further comprises a second reflective layer disposed between the second transparent conductive layer and the substrate.

15. The light-emitting display apparatus of claim 14, wherein the first reflective layer comprises a plurality of apertures.

16. A light-emitting display apparatus, comprising:
a substrate comprising a first region adjacent to a second region;
a first pixel electrode overlapping the first region, the first pixel electrode comprising:
a first reflective layer; and
a first transparent conductive layer, the first reflective layer being disposed between the substrate and the first transparent conductive layer;
a second pixel electrode overlapping the second region, the second pixel electrode comprising:
a second reflective layer; and
a second transparent conductive layer, the second reflective layer being disposed between the substrate and the second transparent conductive layer;
a first electroluminescent layer disposed on the first pixel electrode, over the first transparent conductive layer, the first electroluminescent layer being configured to emit light in a first range of wavelengths; and
a second electroluminescent layer disposed on the second pixel electrode, the second electroluminescent layer being configured to emit light in a second range of wavelengths different from the first range of wavelengths,
wherein:
the first reflective layer comprises a plurality of apertures overlapping the first region; and
the first transparent conductive layer is free of apertures overlapping the first region.

17. The light-emitting display apparatus of claim 16, wherein:
each of the second reflective layer and the second transparent conductive layer is free of apertures overlapping the second region.

18. The light-emitting display apparatus of claim 16, wherein, in a view normal to the substrate, at least one of the apertures in the first reflective layer forms a circular shape, an ovular shape, a square shape, or a rectangular shape.

19. The light-emitting display apparatus of claim 16, wherein the first reflective layer and the second reflective layer comprise silver.

20. The light-emitting display apparatus of claim 16, further comprising:
a third pixel electrode overlapping the first region, the third pixel electrode comprising:
a third reflective layer; and
a third transparent conductive layer, the third reflective layer being disposed between the substrate and the third transparent conductive layer; and
a third electroluminescent layer disposed on the third pixel electrode, the third electroluminescent layer being configured to emit light in a third range of wavelengths different from the first range of wavelengths and the second range of wavelengths,
wherein:
the third reflective layer comprises one or more apertures; and
the third transparent conductive layer is free of apertures overlapping the first region.

21. The light-emitting display apparatus of claim 20, wherein:
the first region comprises a red pixel and a green pixel; and
the second region comprises a blue pixel.

22. A light-emitting display apparatus, comprising:
a substrate comprising a first region adjacent to a second region;
a first pixel electrode overlapping the first region, the first pixel electrode comprising a first reflective layer;
a second pixel electrode overlapping the second region, the second pixel electrode comprising a second reflective layer;
a third pixel electrode overlapping a third region of the substrate adjacent to at least one of the first region and the second region, the third pixel electrode comprising a third reflective layer;
a first electroluminescent layer disposed on the first pixel electrode, the first electroluminescent layer being configured to emit light in a first range of wavelengths; and
a second electroluminescent layer disposed on the second pixel electrode, the second electroluminescent layer being configured to emit light in a second range of wavelengths different from the first range of wavelengths; and
a third electroluminescent layer disposed on the third pixel electrode, the third electroluminescent layer being configured to emit light in a third range of wavelengths different from the first range of wavelengths and the second range of wavelengths,
wherein:
the third region comprises a green pixel;
the third reflective layer comprises only one aperture overlapping the third region; and
a transparent conductive layer being free of apertures directly on the third reflective layer and overlapping the third region.

23. The light-emitting display apparatus of claim 22, wherein:
the first region comprises a red pixel;
the second region comprises a blue pixel; and
the first reflective layer comprises a plurality of apertures overlapping the first region.

* * * * *